United States Patent
Wamura et al.

(10) Patent No.: US 9,435,026 B2
(45) Date of Patent: Sep. 6, 2016

(54) FILM DEPOSITION APPARATUS

(71) Applicant: Tokyo Electron Limited, Tokyo (JP)

(72) Inventors: Yu Wamura, Iwate (JP); Tomonori Kuwamoto, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 427 days.

(21) Appl. No.: 14/224,205

(22) Filed: Mar. 25, 2014

(65) Prior Publication Data
US 2014/0290578 A1 Oct. 2, 2014

(30) Foreign Application Priority Data
Mar. 28, 2013 (JP) ................................ 2013-069414

(51) Int. Cl.
C23C 16/44 (2006.01)
C23C 16/455 (2006.01)

(52) U.S. Cl.
CPC ..... C23C 16/4401 (2013.01); C23C 16/45551 (2013.01); C23C 16/45572 (2013.01)

(58) Field of Classification Search
CPC ............... C23C 16/4401; C23C 16/45551; C23C 16/45572
USPC ................ 118/730, 725; 156/345.55, 345.52
See application file for complete search history.

(56) References Cited

U.S. PATENT DOCUMENTS

| | | | | |
|---|---|---|---|---|
| 8,465,591 B2* | 6/2013 | Kato | ............ | C23C 16/402 118/719 |
| 8,642,487 B2* | 2/2014 | Kato | ............ | H01L 21/02274 257/E21.463 |
| 8,853,100 B2* | 10/2014 | Igeta | ............ | H01L 21/0228 118/715 |
| 8,871,654 B2* | 10/2014 | Kato | ............ | H01L 21/02233 438/771 |
| 8,927,440 B2* | 1/2015 | Kato | ............ | H01L 21/0228 118/696 |
| 9,040,434 B2* | 5/2015 | Kato | ............ | H01L 21/02263 118/724 |
| 9,111,747 B2* | 8/2015 | Yamawaku | ............ | H01L 21/02104 |
| 9,252,043 B2* | 2/2016 | Ikegawa | ............ | H01L 21/76 |
| 9,293,321 B2* | 3/2016 | Tamura | ............ | H01L 21/02219 |
| 9,349,589 B2* | 5/2016 | Enomoto | ............ | C23C 16/4584 |
| 9,368,341 B2* | 6/2016 | Tamura | ............ | H01L 21/02164 |
| 9,376,751 B2* | 6/2016 | Miura | ............ | C23C 16/52 |
| 9,388,496 B2* | 7/2016 | Hane | ............ | H01L 21/02164 |
| 2010/0050942 A1* | 3/2010 | Kato | ............ | C23C 16/401 118/730 |
| 2010/0050943 A1* | 3/2010 | Kato | ............ | C23C 16/401 118/730 |
| 2010/0050944 A1* | 3/2010 | Kato | ............ | C23C 16/401 118/730 |
| 2010/0055312 A1* | 3/2010 | Kato | ............ | C23C 16/45502 427/255.26 |
| 2010/0055314 A1* | 3/2010 | Kato | ............ | H01L 21/02104 427/255.28 |
| 2010/0055316 A1* | 3/2010 | Honma | ............ | C23C 16/45551 427/255.28 |
| 2010/0055319 A1* | 3/2010 | Kato | ............ | C23C 16/45544 427/255.28 |
| 2010/0055320 A1* | 3/2010 | Honma | ............ | C23C 16/45544 427/255.28 |

(Continued)

FOREIGN PATENT DOCUMENTS

JP 3952341 8/2007
JP 2008-508744 3/2008

(Continued)

*Primary Examiner* — Rudy Zervigon
(74) *Attorney, Agent, or Firm* — IPUSA, PLLC

(57) ABSTRACT

In discharging a source gas from a first process gas nozzle, rectifying members including a coolant flow passage provided in a concertinaing manner therein are arranged both sides of the first process gas nozzle. Then, a coolant at a temperature higher than a liquefaction temperature of the source gas and lower than a thermal decomposition temperature of the source gas is flown through the coolant flow passage, by which the first process gas nozzle is cooled through the rectifying member.

6 Claims, 12 Drawing Sheets

(56) References Cited

U.S. PATENT DOCUMENTS

| | | | |
|---|---|---|---|
| 2010/0055347 A1* | 3/2010 | Kato | C23C 16/452 427/569 |
| 2010/0116210 A1* | 5/2010 | Kato | C23C 16/4584 118/730 |
| 2010/0151131 A1* | 6/2010 | Obara | C23C 16/4412 427/255.28 |
| 2010/0229797 A1* | 9/2010 | Kato | C23C 16/402 118/730 |
| 2010/0260935 A1* | 10/2010 | Kato | C23C 16/402 427/255.28 |
| 2011/0039026 A1* | 2/2011 | Kato | C23C 16/402 427/255.26 |
| 2011/0100489 A1* | 5/2011 | Orito | C23C 16/45502 137/560 |
| 2011/0104395 A1* | 5/2011 | Kumagai | C23C 16/402 427/554 |
| 2011/0139074 A1* | 6/2011 | Kato | C23C 16/4412 118/730 |
| 2011/0151122 A1* | 6/2011 | Kato | C23C 16/402 427/255.23 |
| 2011/0155056 A1* | 6/2011 | Kato | C23C 16/45538 118/719 |
| 2011/0155057 A1* | 6/2011 | Kato | C23C 16/45519 118/719 |
| 2011/0155062 A1* | 6/2011 | Kato | C23C 16/45519 118/728 |
| 2011/0159187 A1* | 6/2011 | Kato | C23C 16/45544 427/255.26 |
| 2011/0159188 A1* | 6/2011 | Kato | C23C 16/34 427/255.394 |
| 2011/0159702 A1* | 6/2011 | Ohizumi | C23C 16/45551 438/778 |
| 2011/0214611 A1* | 9/2011 | Kato | C23C 16/45519 118/719 |
| 2011/0236598 A1* | 9/2011 | Kumagai | C23C 16/45536 427/569 |
| 2012/0052693 A1* | 3/2012 | Ozaki | C23C 16/402 438/771 |
| 2012/0076937 A1* | 3/2012 | Kato | C23C 16/45551 427/248.1 |
| 2012/0094011 A1* | 4/2012 | Hishiya | C23C 16/45548 427/8 |
| 2012/0222615 A1* | 9/2012 | Kato | H01L 21/68764 118/719 |
| 2012/0267341 A1* | 10/2012 | Kato | H01L 21/02164 216/37 |
| 2013/0042813 A1* | 2/2013 | Kato | C23C 16/45578 118/730 |
| 2013/0047923 A1* | 2/2013 | Kato | H01L 21/02164 118/723 AN |
| 2013/0047924 A1* | 2/2013 | Enomoto | H01L 21/67103 118/725 |
| 2013/0059415 A1* | 3/2013 | Kato | C23C 16/345 438/106 |
| 2013/0061804 A1* | 3/2013 | Enomoto | H01L 21/6719 118/719 |
| 2013/0074770 A1* | 3/2013 | Honma | C23C 16/401 118/719 |
| 2013/0087097 A1* | 4/2013 | Kato | H01J 37/321 118/663 |
| 2013/0164936 A1* | 6/2013 | Oshimo | H01L 28/60 438/680 |
| 2013/0164942 A1* | 6/2013 | Kato | H01L 21/30 438/758 |
| 2013/0164945 A1* | 6/2013 | Furuya | H01L 21/02178 438/763 |
| 2013/0180452 A1* | 7/2013 | Kato | C23C 16/458 118/719 |
| 2013/0189849 A1* | 7/2013 | Kato | H01L 21/0206 438/758 |
| 2013/0203268 A1* | 8/2013 | Kato | H01L 21/02263 438/778 |
| 2013/0206067 A1* | 8/2013 | Kato | H01L 21/02104 118/719 |
| 2013/0276705 A1* | 10/2013 | Kato | C23C 16/4584 118/725 |
| 2013/0337658 A1* | 12/2013 | Ikegawa | H01L 21/0262 438/782 |
| 2014/0011370 A1* | 1/2014 | Kato | H01L 21/0206 438/782 |
| 2014/0024200 A1* | 1/2014 | Kato | H01L 21/02617 438/473 |
| 2014/0113436 A1* | 4/2014 | Kato | C23C 16/45527 438/478 |
| 2014/0179104 A1* | 6/2014 | Oshimo | H01L 21/68771 438/680 |
| 2014/0179120 A1* | 6/2014 | Ogawa | C23C 16/4551 438/782 |
| 2014/0179121 A1* | 6/2014 | Ikegawa | H01L 21/02148 438/782 |
| 2014/0179122 A1* | 6/2014 | Tachibana | H01L 21/02148 438/782 |
| 2014/0199856 A1* | 7/2014 | Kato | H01L 21/68771 438/782 |
| 2014/0209028 A1* | 7/2014 | Oshimo | H01L 21/68771 118/730 |
| 2014/0220260 A1* | 8/2014 | Yamawaku | C23C 16/45519 427/569 |
| 2014/0290578 A1* | 10/2014 | Wamura | C23C 16/4401 118/725 |
| 2014/0345523 A1* | 11/2014 | Kikuchi | C23C 16/52 118/712 |
| 2014/0347465 A1* | 11/2014 | Takahashi | G06T 7/0004 348/87 |

FOREIGN PATENT DOCUMENTS

| | | |
|---|---|---|
| JP | 2008-538256 | 10/2008 |
| JP | 2011-100956 | 5/2011 |
| WO | WO 2006/020424 | 2/2006 |
| WO | WO 2006/107573 | 10/2006 |

\* cited by examiner

FILM DEPOSITION APPARATUS

CROSS-REFERENCE TO RELATED APPLICAITONS

This patent application is based upon and claims the benefit of priority of Japanese Patent Application No. 2013-69414, filed on Mar. 28, 2013, the entire contents of which are incorporated herein by reference.

BACKGROUND OF THE INVENTION

1. Field of the Invention

The present invention relates to a film deposition apparatus that deposits a thin film on a substrate by supplying a plurality of process gases that react with each other to the substrate in turn.

2. Description of the Related Art

A process is known that alternately supplies a plurality of, for example, two kinds of process gases that react with each other to a substrate such as a semiconductor wafer (which is hereinafter called "wafer") as a method of depositing a high dielectric film such as hafnium oxide (Hf—O) on the substrate. In this method, a thin film is formed by depositing an atomic layer or a molecular layer on the wafer in a layer-by-layer manner, and the method is called an ALD (Atomic Layer Deposition) method as a generic term. When depositing a hafnium oxide film, a TDMAH (Tetrakis(dimethylamino)hafnium) gas and an ozone ($O_3$) gas are respectively used as a source gas and an oxidation gas, and a film deposition temperature is set at about 250 degrees C. As an apparatus to deposit a high dielectric film by the ALD method, a configuration is known that includes a turntable to rotate a wafer and gas injectors lined up away from each other along a moving path of the wafer on the turntable that are arranged in a vacuum chamber.

Some devices utilizing the high dielectric film are required to contain impurities as little as possible, for example, to reduce a leak current. To achieve this, setting a film deposition temperature high is advisable. However, when the film deposition temperature is set at a decomposition temperature of a source gas or higher, a decomposed matter is attached to an inner wall of a gas injector due to the thermal decomposition of the source gas. This is because an internal pressure of the gas injector is likely to become higher than a pressure of the vacuum chamber. When the decomposed matter is attached to the inner wall of the gas injector, the decomposed matter is likely to cause particles by being released from the inner wall in the middle of the film deposition process. Accordingly, to reduce the amount of particles, maintenance of the gas injector has to be performed frequently. Hence, there is a trade-off between depositing a high-quality high dielectric film and reducing adhesion of the attached decomposed matter within the gas injector, and it is very difficult to reduce the adhesion of the attached decomposed matter while depositing a high-quality thin film.

Japanese Patent No. 3952341 discloses a technique in which a nitrogen gas is supplied from a surface of an injector to reduce a reaction between tin tetrachloride and water vapor on a surface of the injector when a thin film is deposited by using a CVD (Chemical Vapor Deposition) method. Japanese Laid-Open Patent Application Publication No. 2008-508744 and Japanese Laid-Open Patent Application Publication No. 2008-538256 disclose a technique that cools an injector head or an injector. However, these patent documents do not study the thermal decomposition of a source gas when depositing a thin film by the ALD method. Moreover, Japanese Laid-Open Patent Application Publication No. 2011-100956 discloses an example of combining a rectifying member with an apparatus including the above-mentioned turntable, but does not disclose a problem in depositing a high dielectric film.

SUMMARY OF THE INVENTION

Embodiments of the present invention provide a novel and useful film deposition apparatus solving one or more of the problems discussed above.

More specifically, embodiments of the present invention provide a film deposition apparatus that can reduce adhesion of a source gas on a surface of a gas injector when supplying the source gas from the gas injector to a substrate being rotated by a turntable.

According to one embodiment of the present invention, there is provided a film deposition apparatus that includes a vacuum chamber, a turntable, a heating mechanism, a gas injector, a rectifying member, a coolant supply port, a coolant discharge port, a reaction gas supply part and an exhaust port. The turntable is provided in the vacuum chamber and configured to rotate a substrate receiving area to receive a substrate. The heating mechanism is configured to heat the substrate on the turntable. The gas injector extends in a direction crossing a moving path of the substrate on the turntable and has a plurality of gas discharge holes formed along the direction crossing the moving path to supply a source gas to the substrate receiving area. The rectifying member is arranged on an upstream side and a downstream side of the gas injector in a rotational direction of the turntable so as to extend along a longitudinal direction of the gas injector and includes a coolant flow passage formed therein. The coolant supply port and a coolant discharge port circulate a coolant through the coolant flow passage. The reaction gas supply part supplies a reaction gas to react with the source gas to the substrate receiving area and is provided away from the gas injector in a circumferential direction of the turntable. The exhaust port evacuates the vacuum chamber.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERED EMBODIMENTS

Figure 1:
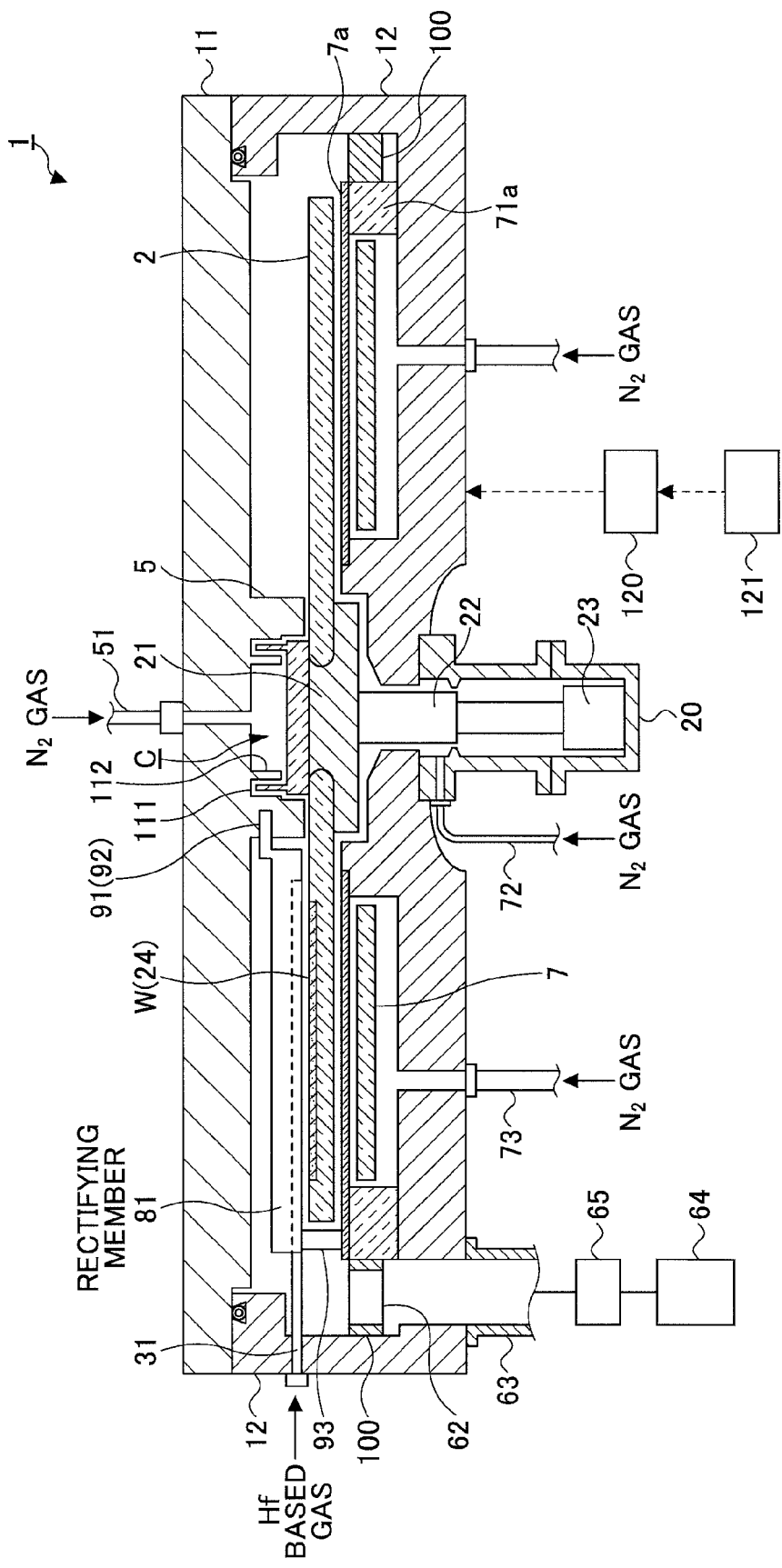
FIG. 1 is a vertical cross-sectional side view illustrating an example of a film deposition apparatus of an embodiment of the present invention.
Figure 2:
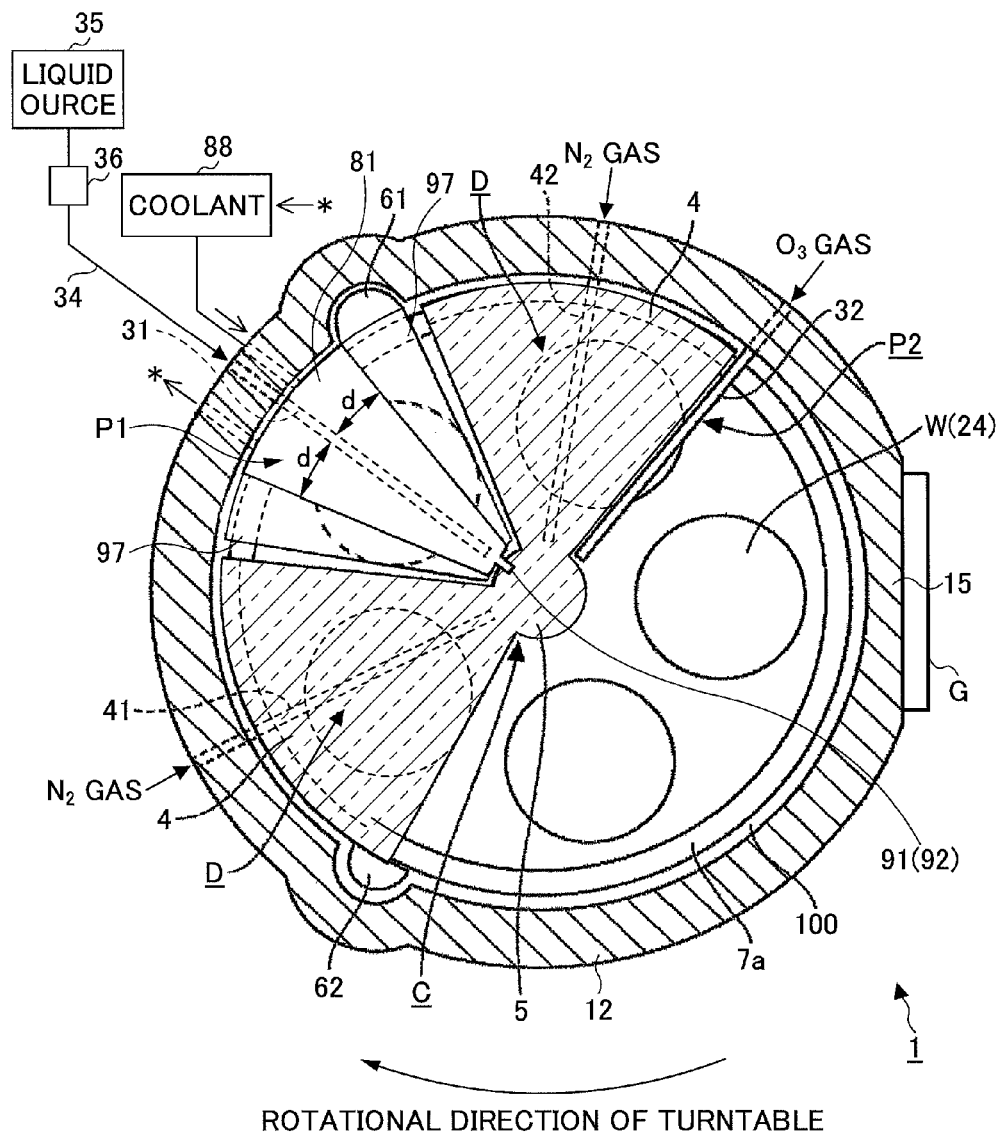
FIG. 2 is a horizontal cross-sectional view of a film deposition apparatus of an embodiment of the present invention.

A description is given below of an example of a film deposition apparatus of an embodiment of the present invention, with reference to FIGS. 1 through 5. As shown in FIGS. 1 and 2, this film deposition apparatus includes a vacuum chamber 1 having an approximately circular planar shape, and a turntable 2 provided in the vacuum chamber 1, having a rotational center that coincides with a center of the vacuum chamber 1. The film deposition apparatus is configured to deposit a film such as a hafnium oxide film by alternately supplying two kinds of process gases that react with each other onto a wafer W. The film deposition apparatus, as described in detail later, prevents a source gas from pyrolytically decomposing on a surface of a gas injector that supplies the source gas while performing a deposition process at a decomposition temperature or higher of the source gas. Hereinafter, a description is given of a specific configuration of the film deposition apparatus.

A separation gas supply pipe 51 that circulates a separation gas ($N_2$ gas) in the vacuum chamber 1 is connected to a central part of a ceiling plate 11 of the vacuum chamber 1 to separate processing areas P1, P2 described later from each other. A part on the lower face side of the ceiling plate 11 protrudes downward and has a ring-like shape and forms a protruding part (wall surface portion) 5 so as to surround an area to which the separation gas supply pipe supplies the nitrogen gas. As shown in FIG. 1, a heater unit 7 that is a heating mechanism is provided under the turntable 2, and the film deposition apparatus is configured to heat the wafer W to a film deposition temperature, for example, 250 through 500 degrees C., through the turntable 2. In FIG. 1, a cover member 7a provided between the heater unit 7 and the turntable 2 is shown, and is configured so that an outer periphery of the cover member 7a protrudes to the outside of the outer edge of the turntable 2.

The turntable 2 is, for example, made of quartz, and is fixed to a core portion 21 approximately formed into a cylindrical shape at the central part. The turntable 2 is configured to be rotatable by a rotational shaft 22 connected to a lower surface of the core portion 21, around the vertical axis in a clockwise direction in this example. In FIG. 1, a drive part (i.e. a rotation mechanism) 23 is provided to rotate the rotational shaft 22 around the vertical axis, and a case body 20 houses the rotational shaft 22 and the drive part 23.

Figure 3:
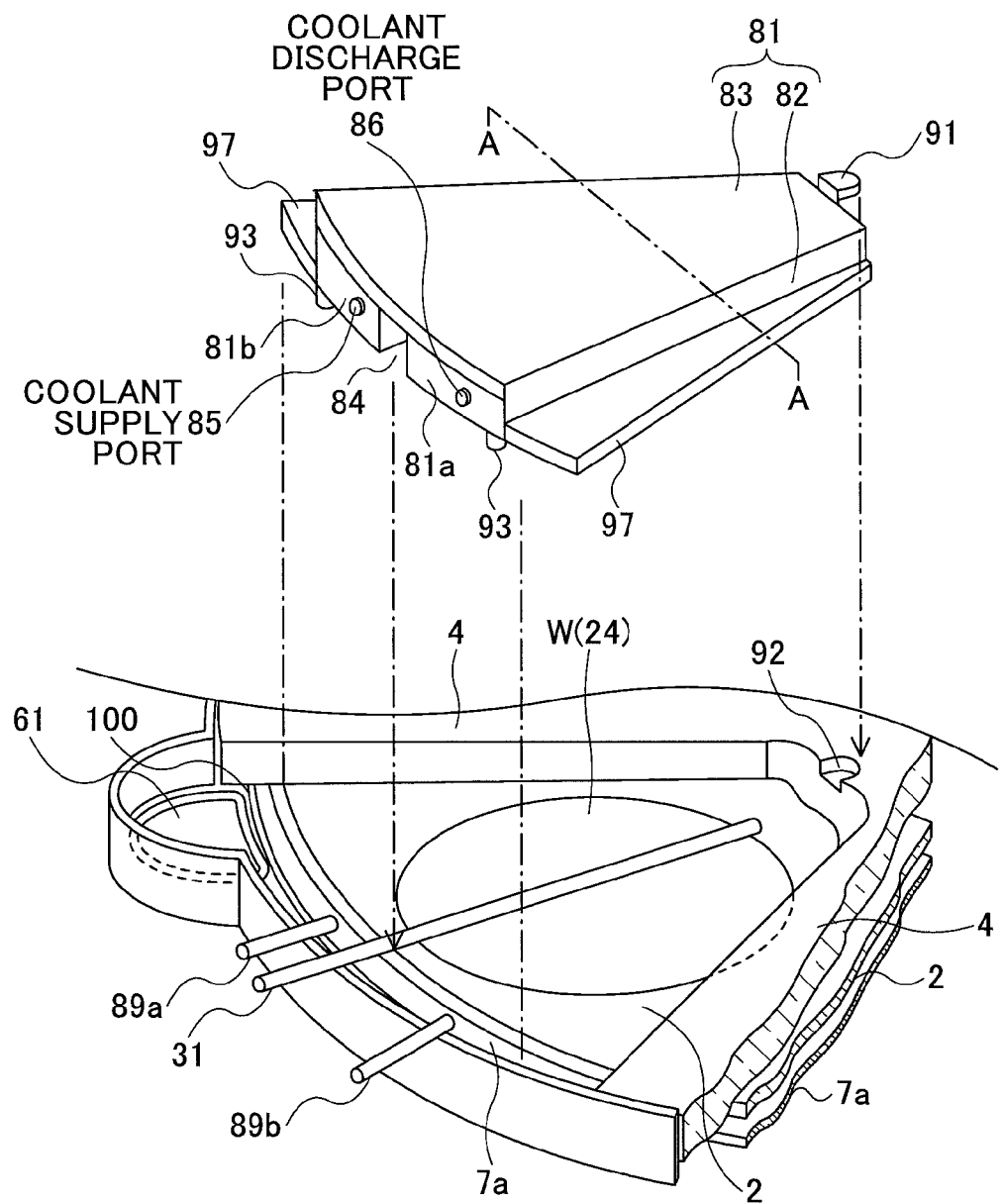
FIG. 3 is an exploded perspective view illustrating a part of a film deposition apparatus of an embodiment of the present invention.

As shown in FIGS. 2 and 3, concave portions 24 that constitute a substrate receiving area to receive the wafer W having a diameter, for example, of 300 mm are formed along a rotational direction (i.e., circumferential direction) of the turntable 2 at a plurality of locations, for example, at five locations. Four nozzles 31, 32, 41 and 42 each made of, for example, quartz are arranged in a radial fashion at intervals in the circumferential direction of the vacuum chamber 1 at respective positions opposite to a passing area of the concave portions 24. These respective nozzles 31, 32, 41 and 42 are each installed, for example, so as to horizontally and linearly extend from the outer peripheral wall of the vacuum chamber 1 toward the central area C and to cross a moving path of the wafer W. The nozzles 31, 32, 41 and 42 are configured to be able to adjust a height position and an inclination angle to the turntable 2 through a seal member not shown in the drawing such as an O-ring provided between the inner wall surface and the nozzles 31, 32, 41 and 42.

In this example, the separation gas nozzle 41, the first process gas nozzle 31 (i.e., gas injector), the separation gas nozzle 42, and the second process gas nozzle 32 are arranged in this order in a clockwise fashion (i.e., the rotational direction of the turntable 2) when seen from a transfer opening 15 described below. A plurality of gas discharge holes 33 is respectively formed, for example, on the lower surfaces of these gas nozzles 31, 32, 41 and 42, and is arranged at a plurality of locations along the radial direction of the turntable 2, for example, at regular intervals. The process gas nozzles 31 and 32 respectively form a first process gas supply part and a second process gas (i.e., reaction gas) supply part, and the separation gas nozzles 41 and 42 form separation gas supply parts.

Next, a description is given below of types of gases discharged from the nozzles 31, 32, 41 and 42. More specifically, as shown in FIG. 2, the first process gas nozzle 31 is connected to a supply source (which has, more specifically, a configuration for blowing a carrier gas into a storage portion storing a heated liquid source) 35 of a first process gas (i.e., source gas) containing hafnium (Hf) such as a TDMAH gas through a gas supply passage 34. The gas supply passage 34 is configured to heat the source gas that circulates through the gas supply passage 34 to a heating temperature higher than a liquefaction temperature (condensing temperature) and lower than a decomposition temperature of the liquid source. In this example, the heating temperature is set at, for example, 80 through 150 degrees C. An area under the process gas nozzle 31 forms a first process area. FIG. 2 also illustrates a valve 36 provided in the gas supply passage 34.

The second process gas nozzle 32 is connected to a supply source (not shown in the drawing) of a second process gas such as an ozone ($O_3$) gas to form a second process area P2 that reacts with a component of the first process gas adsorbed on the surface of the wafer W under the second process gas nozzle 32. The separation gas nozzles 41 and 42 are connected to a supply source (not shown in the drawing) of the nitrogen gas that is the separation gas to form separation areas D to separate the first process area P1 and the second process area P2 from each other.

Subsequently, a description returns to a configuration of the first process gas nozzle 31 described above. A rectifying member 81 approximately formed into a box-like shape is provided so as to surround both sides and an upper part of the first process gas nozzle 31 to circulate the gas discharged from the first process gas nozzle 31 along the turntable 2. More specifically, the rectifying member 81 is formed so as to shorten the length of its circumference as moving from the outer edge side to the central area side of the turntable 2 along in a radial direction and to form an approximate sector as seen from a planar perspective. The rectifying member 81 is constituted of a lower member 82 and an upper member 83. The upper member 83 is welded to an upper side of the lower member 82. Moreover, a groove portion 84 is formed in a lower surface of the rectifying member 81 along the radial direction of the turntable 2 to house the first process gas nozzle 31 therein. In this example, the rectifying member 81 is formed to extend along the longitudinal direction of the first process gas nozzle 31, and is made of metal such as aluminum and the like.

As illustrated in FIG. 3, when the rectifying member 81 on the upstream side of the first process gas nozzle 31 in the rotational direction of the turntable 2 is used as a rectifying member 81a, and the rectifying member 81 on the downstream side of the first process gas nozzle 31 in the rotational direction of the turntable 2 is used as a rectifying member 81b, as illustrated in FIG. 2, these rectifying members 81a and 81b are configured to have the same arc length dimension d in the circumferential direction of the turntable 2. The first process gas nozzle 31 extends between the rectifying members 81a and 81b in the radial direction and terminates at a part close to the center of the turntable 2. These rectifying members 81a and 81b are connected to each other at a part facing (a facing part) the central tip of the first process gas nozzle 31.

Figure 4:
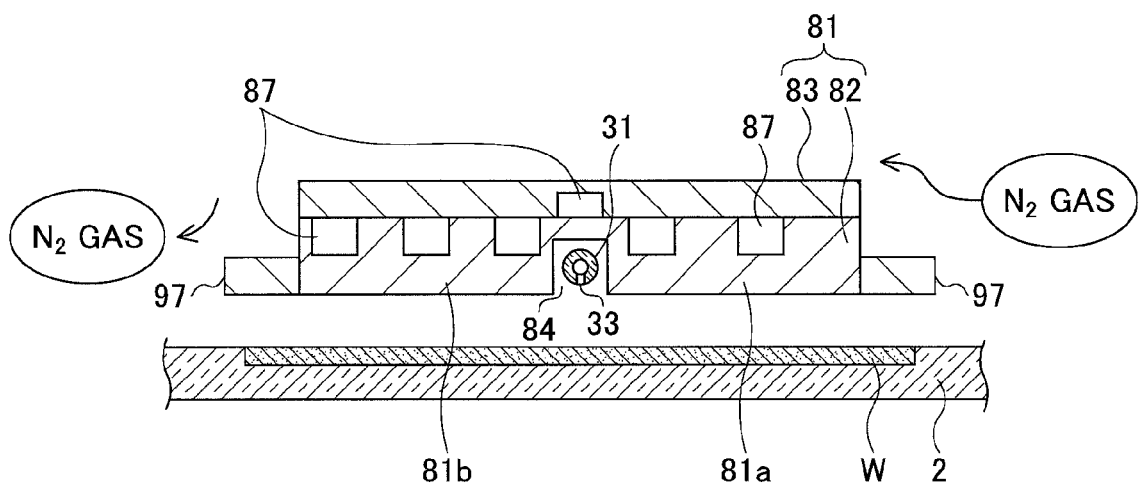
FIG. 4 is a vertical cross-sectional view illustrating a first example of a rectifying member installed in a film deposition apparatus of an embodiment of the present invention.
Figure 5:
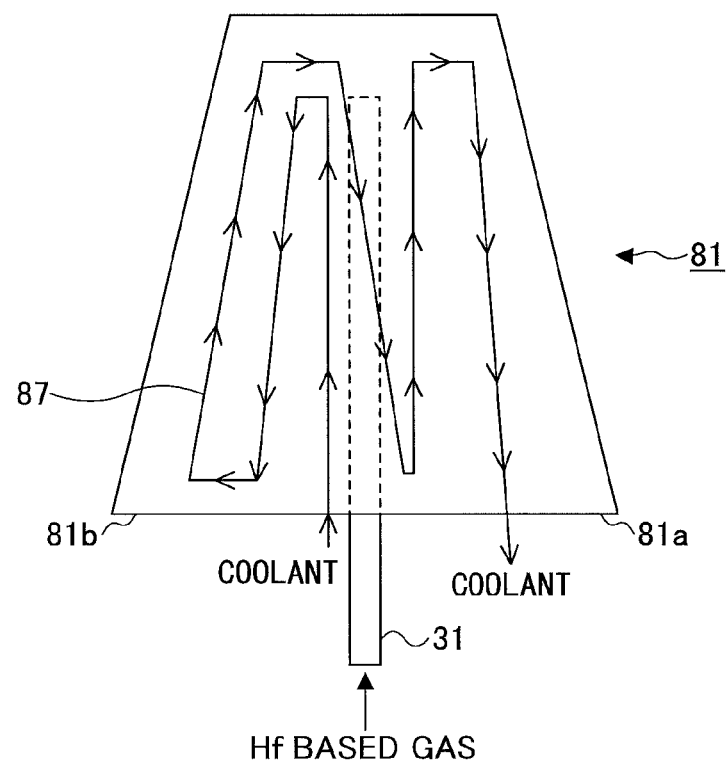
FIG. 5 is a plan view schematically illustrating a flow passage of a coolant in the rectifying member of the first example.

As illustrated in FIG. 3, a coolant supply port 85 to supply a coolant to the rectifying member 81b is formed in an outer end surface of the rectifying member 81b located downstream of the groove portion 84 in the rotational direction of the turntable 2, at a location close to the groove portion 84. Furthermore, a coolant discharge port 86 to discharge coolant from the rectifying member 81 is formed in an outer end surface of the rectifying member 81a located upstream of the groove portion 84 in the radial direction of the turntable 2, at a location close to a radial side portion of the rectifying member 81a on the upstream side in the rotational direction of the turntable 2. As illustrated in FIGS. 4 and 5, a coolant flow passage 87 to discharge the coolant to the coolant discharge port 86 supplied from the coolant supply port 85 is drawn to be formed in a concertinaing manner. More specifically, by forming the coolant flow passage 87 into a groove shape in the upper surface of the lower member 82 and the lower surface of the upper member 83, respectively, and by welding the upper surface and the lower surface of these members 82 and 83 to each other, the coolant flow passage 87 is configured to allow the coolant to flow between the ports 85 and 86.

More specifically, as schematically illustrated in FIGS. 4 and 5, in the lower member 82 in the rectifying member 81b on the downstream side of the groove portion 84 in the rotational direction of the turntable 2, the coolant flow passage 87 horizontally extends from the coolant supply port 85 toward the rotational center of the turntable 2 along the first process gas nozzle 31. Apart of the coolant flow passage 87 bends in the vicinity of the central terminal end of the first process gas nozzle 31 so as to be positioned in an area on the outer periphery side and bends again at the area on the outer periphery side so as to further aim for the rotational center. In addition, at a part close to the center of the turntable 2, the coolant flow passage 87 is formed in the upper surface of the lower member 82 at the location close to the first process gas nozzle 31.

In the upper member 83, the coolant flow passage 87 is formed so as to cross the first process gas nozzle 31 as seen from a planar perspective, and one end is open downward at a location overlapping with an open end of the coolant flow passage 87 in the rectifying member 81b. The other end of the coolant flow passage 87 in the upper member 83 is open downward on the upstream side of the first process gas nozzle 31 in the rotational direction at a location close to the outer edge side of the turntable 2.

In the rectifying member 81a on the upstream side of the groove portion 84 in the rotational direction of the turntable 2, the coolant flow passage 87 is open at the upper surface side at a location corresponding to the opening portion of the coolant flow passage 87 in the upper member 83, horizontally extends toward an area on the rotational center side, and bends at the area so as to aim for the coolant discharge port 86. In this manner, the coolant flow passage 87 is drawn around within the rectifying member 81 from the coolant supply port 85 toward the coolant discharge port 86. Accordingly, in these rectifying members 81a and 81b, the coolant supply port 85 and the coolant discharge port 86 are shared.

As illustrated in FIG. 2, a coolant is connected to the coolant flow passage 87 (not shown in the drawing) discussed above supply source 88 including a temperature adjusting mechanism such as a chiller, and is configured to allow the coolant to be cooled to any cooling temperature for circulation between the ports 85 and 86. In this example, the cooling temperature is, for example, the same as the heating temperature of the gas supply passage 34 (i.e., a temperature higher than the liquefaction temperature of the source gas and lower than a decomposition temperature of the source gas), and is more specifically, 150 through 200 degrees C. Moreover, for example, a fluoride-based heat medium (e.g., Galden™), pure water or a nitrogen gas is available for the coolant, with the fluoride-based heat medium used as the coolant in this example.

As illustrated in FIGS. 2 and 3, a coolant supply pipe 89a and a coolant discharge pipe 89b extending from the coolant supply source 88 are hermetically attached to a side wall surface of the vacuum chamber 1. The coolant supply pipe 89a and the coolant discharge pipe 89b are made of metal such as stainless steel, and are hermetically connected to the coolant supply port 85 and the coolant discharge port 86, respectively. More specifically, after attaching the rectifying member 81 to the vacuum chamber 1, the coolant supply source 88 and the coolant flow passage 87 are connected to each other by inserting the coolant supply pipe 89a and the coolant discharge pipe 89b into the coolant supply port 85 and the coolant discharge port 86, respectively, through the side wall surface of the vacuum chamber 1. Here, FIG. 4 discussed above illustrates a cross-sectional view of the rectifying member 81 cut by an A-A line in FIG. 3.

The central terminal end of the rectifying member 81 terminates at an engagement part (supporting part) 91. In a part facing the locking part 91 of the protruding part 5, a groove that forms an engagement receiving part 92 is formed to engage with the engagement part 91, and the central radial end of the rectifying member 81 is configured to be supported by the engagement receiving part 92 in the protruding part 5. Furthermore, supporting parts 93 extending downward from the lower surface of the rectifying member 81 are formed at locations close to the outer periphery of the turntable 2 in the lower surface of the rectifying member 81 so as to be away from each other, for example, at two locations. In addition, the base side of the rectifying member 81 is supported by the supporting parts 93 through the above-mentioned cover member 7a.

As illustrated in FIGS. 2 through 4, in end portions on the upstream side and the downstream side of the rectifying member 81 in the rotational direction of the turntable 2, rectifying plates 97 horizontally extending from the respective end portions are formed. The rectifying plates 97 are made of metal such as aluminum, and are formed through the radial direction of the turntable 2. Hence, as illustrated in FIG. 4, nitrogen gas flows from the upstream side in the rotational direction of the turntable 2 toward the rectifying member 81, and is discharged to an exhaust port 61 through an area between the rectifying member 81 and the ceiling plate 11 so as to flow away from an area under the rectifying member 81. Accordingly, dilution of the Hf based gas by the nitrogen gas is prevented in the area under the rectifying member 81. Here, depiction of the rectifying plate 97 is omitted in FIG. 5.

Convex portions 4 formed into an approximate sector of the turntable 2 as seen from a planar perspective are provided on the lower surface of the ceiling plate 11, and the separation gas nozzles 41 and 42 are respectively housed in the convex portions 4. Accordingly, low ceiling surfaces that are the lower surfaces of the convex portions 4 are arranged on the ceiling plate 11 of the vacuum chamber 1 in the separation areas D to prevent the respective process gases from being mixed with each other.

A ring-shaped side ring 100 is arranged at an outer edge side of the turntable 2 so as to fill a space between the turntable 2 and the inner wall surface of the vacuum chamber 1 therewith, and as illustrated in FIG. 1, exhaust ports 61 and 62 are formed so as to correspond to the first process area P1 and the second process area P2, respectively. As illustrated in FIG. 2, the first exhaust port 61 is provided between the first process area P1 and the separation area D located at the downstream side of the first process area P1 in the rotational direction of the turntable 2. The second exhaust port 62 is provided between the second process area P2 and the separation area D located at the downstream side of the second process area P2 in the rotational direction of the turntable 2. Exhaust pipes 63 extend from the first exhaust port 61 and the second exhaust port 62 connected to evacuation mechanisms such as vacuum pumps 64 through pressure controllers 65 such as butterfly valves.

As shown in FIG. 2, a transfer opening 15 is provided in the side wall of the vacuum chamber 1 to transfer the wafer W between a transfer arm (which is not shown in the drawings) provided outside the vacuum chamber 1 and the turntable 2. The transfer opening 15 is configured to be hermetically openable and closable by a gate valve G. In addition, because the wafer W is transferred into or from the concave portions 24 at a position facing the transfer opening 15 with the transfer arm, lift pins for lifting up the wafer W from its back side for transfer by penetrating through through-holes formed in the concave portions 24 (which are not shown in the drawing) are provided at the position facing the transfer opening 15 under the turntable 2. In FIG. 1, supply pipes 72 and 73 supplying a nitrogen gas into the vacuum chamber 1 are provided, and wall portions 111 and 112 vertically extending from the core portion 21 and the ceiling plate 11, respectively, are also provided.

Moreover, as illustrated in FIG. 1, a control part 120 constituted of a computer to control the entire operation of the apparatus is provided in this film deposition apparatus, and a program to implement a film deposition process described later is stored in a memory of the control part 120. This program is constituted of instructions of step groups to cause the apparatus to implement operations, and is installed from a memory unit 121 that is a storage medium such as a hard disk, a compact disc, a magnetic optical disk, a memory card and a flexible disk into the control part 120.

Next, a description is given of an operation in an embodiment of the present invention. To begin with, the gate valve G is opened, and while rotating the turntable 2 intermittently, for example, five wafers W are placed on the turntable 2 through the transfer opening 15. Next, the gate valve G is closed, and the turntable 2 is rotated at, for example, 2 through 240 rpm in a clockwise fashion while the inside of the vacuum chamber 11 is continuously evacuated by the vacuum pump 64. Then the wafers W are heated by the heater unit 7 up to the above-mentioned film deposition temperature. The gas supply passage 34 is heated so as not to let an Hf-based gas flowing through the gas supply passage 34 condense and not to let the Hf-based gas pyrolytically decompose.

Subsequently, the coolant adjusted to the above-mentioned cooling temperature is flown through the rectifying member 81. After the elapse of time until the temperature of the rectifying member 81 of the first process gas nozzle 31 settles, an Hf-based gas and an ozone gas are respectively discharged from the process gas nozzle 31 and the second process nozzle 32. Moreover, a separation gas (nitrogen gas) is discharged from the separation gas nozzles 41 and 42 into the vacuum chamber 1 at a predetermined flow rate. Then, a pressure in the vacuum chamber 1 is adjusted to a preset processing pressure (e.g., 133 Pa (1.0 Torr)) by the pressure controllers 65.

Figure 6:
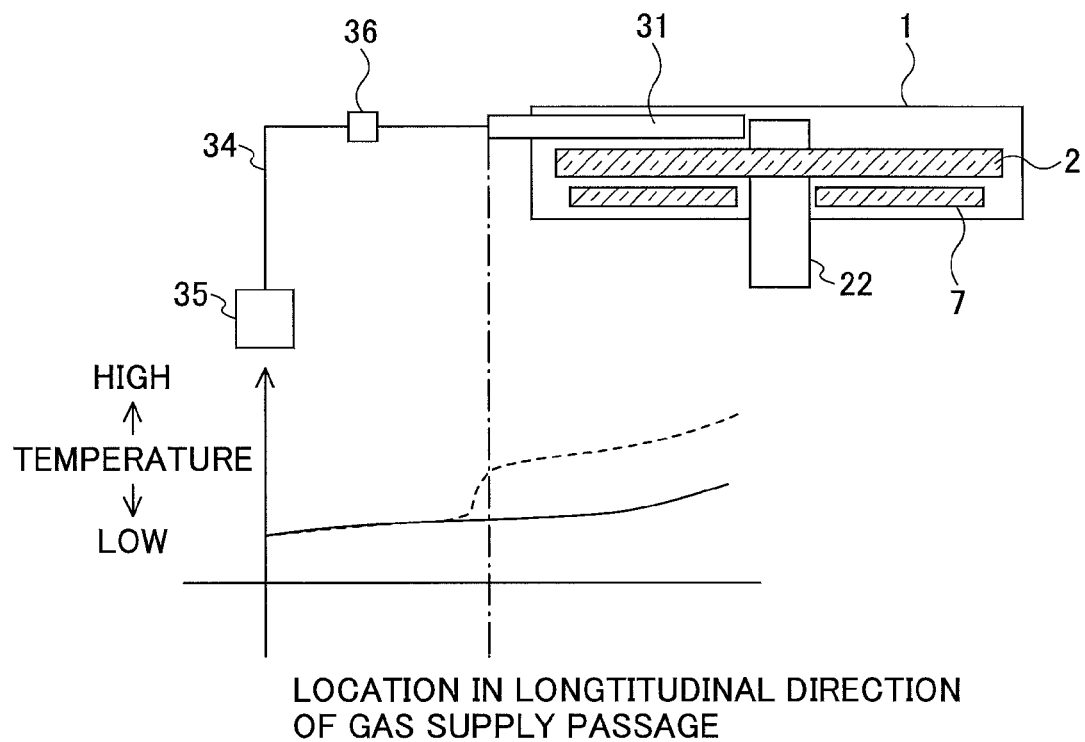
FIG. 6 is an overall view illustrating a temperature gradient of a source gas.

Here, in flowing the Hf-based gas from the gas supply source 35 to the vacuum chamber 1, the film deposition temperature (i.e., heating temperature of the wafer W) in the vacuum chamber 1 is higher than the decomposition temperature (e.g., 250 degrees C.) of the Hf-based gas as discussed above. Accordingly, if the coolant is not flown through the rectifying member 81, the Hf-based gas rapidly increases in temperature as shown by a dashed line in FIG. 6 when the Hf-based gas has reached the base end side (on the outer periphery side of the turntable 2) of the first process gas nozzle 31, or as the Hf-based gas flows through the first process gas nozzle 31. Because of this, when the coolant is not flown through the rectifying member 81, for example, thermal decomposition occurs on the surface of the first process gas nozzle 31 and a residue attaches to the surface of the first process gas nozzle 31 before the Hf-based gas contacts the wafer W. In this case, the residue may cause particles to form, or the maintenance (e.g., cleaning or replacement) to be performed on the first process gas nozzle 31 more frequently.

However, as discussed above, in the present embodiment, the rectifying member 81a and 81b including the coolant flow passage 87 embedded therein are respectively arranged on the upstream side and the downstream side of the first process gas nozzle 31 in the rotational direction of the turntable 2. As shown by a solid line in FIG. 6, this prevents the Hf-based gas flowing through the first process gas nozzle 31 from increasing in temperature within the first process gas nozzle 31. More specifically, the Hf-based gas in the first process gas nozzle 31 is maintained at a temperature higher than the liquefaction temperature of the Hf-based gas and lower than the thermal decomposition temperature of the Hf-based gas.

Figure 7:
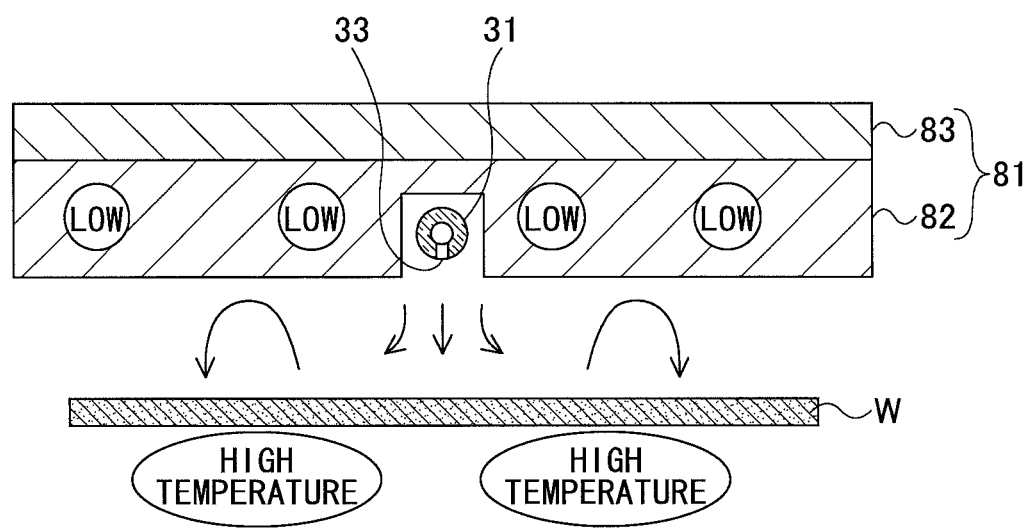
FIG. 7 is a schematic view illustrating an action of an embodiment of the present invention.

Therefore, because the Hf-based gas discharged downward from the first process gas nozzle 31 rapidly exceeds the thermal decomposition temperature on a surface of the wafer W, a product generated by the thermal decomposition of the Hf-based gas is deposited as an adsorbed layer on the surface of the wafer W. Moreover, even if the Hf-based gas flies into an area above the wafer W without adsorbing on the surface of the wafer W, the rectifying member 81 cooled to the temperature lower than the thermal decomposition temperature is located in the area as described above, and the first process gas nozzle 31 is also cooled by the rectifying member 81. This prevents the Hf-based gas in the vacuum chamber 1 from attaching to the rectifying member 81 or the first process gas nozzle 31. Furthermore, because the Hf-based gas flows along the wafers W due to the rectifying members 81a and 81b on both sides of the first process gas nozzle 31, as schematically illustrated in FIG. 7, the Hf-based gas adsorbs on the present wafer W or a surface of a subsequent wafer W while staying in the vacuum chamber 1.

On the other hand, the ozone gas supplied from the second process gas nozzle 32 contacts and reacts with (oxidizes) the adsorbed layer on the surface of the wafer in the second process area P2. Because this wafer W is heated to a temperature higher than the thermal decomposition temperature of the Hf-based gas as discussed above, when the adsorbed layer and the ozone gas react with each other and a reaction layer is deposited, impurities are unlikely to remain in the reaction layer. More specifically, although an organic substance derived from the Hf-based gas might remain in the adsorbed layer, when the hafnium element reacts with the ozone gas, a bond to the organic substance is likely to break at the temperature higher than the thermal decomposition temperature of the Hf-based temperature. Because of this, the reaction layer deposited on the surface of the wafer W is constituted of the hafnium and the oxygen, and a content rate of the impurities can be kept low.

By continuing to rotate the turntable 2 in this manner, adsorption of the adsorbed layer and oxidation of the adsorbed layer is performed many times in this order to each wafer W, and the reaction layer (reaction product) is deposited in a layer-by-layer manner and a thin film is formed.

While performing a series of processes, since the nitrogen gas is supplied to an area between the first process area P1 and the second process area P2 as a separation gas, the respective gases are evacuated without mixing the first process gas and second process gas with each other. In addition, because a purge gas is supplied to the lower side of the turntable 2, the gas likely to disuse to the lower side of the turntable 2 is returned to the exhaust ports 61 and 62 by the purge gas.

According to the above embodiments, in supplying the Hf-based gas from the first process gas nozzle 31 into the vacuum chamber 1, the rectifying member 81 is arranged so as to cover the first process gas nozzle 31. Moreover, by circulating the coolant in the rectifying member 81, the first process gas nozzle 31 is cooled through the rectifying member 81. Due to this, the Hf-based gas is kept at a temperature lower than the thermal decomposition temperature until discharged from the first process gas nozzle 31. In other words, the Hf-based gas, after discharged from the first process gas nozzle 31, is heated toward the thermal decomposition temperature, and reaches the film deposition temperature beyond the thermal decomposition temperature on the surface of the wafer W. This can prevent the Hf-based gas from pyrolytically decomposing on the surface of the first process gas nozzle 31 while heating the wafer W up to the film deposition temperature higher than the thermal decomposition temperature of the Hf-based gas. Accordingly, because the adhesion of the residue to the surface of the first process gas nozzle 31 can be prevented, generation of particles can be prevented and maintenance does not have to be performed so frequently. This enables the use of a higher film deposition temperature to be made further higher because the generation of the particles and the frequency of maintenance can be reduced. Hence, a high-quality thin film containing fewer impurities can be deposited, and a margin of a recipe available for deposition of a thin film can be increased.

Moreover, because the adhesion of the residue on the surface of the rectifying member 81 or the first process gas nozzle 31 can be prevented, the waste of the Hf-based gas can also be prevented. Due to this, utilization ratio of the Hf-based gas (an amount of contribution to a film deposition/an amount of supply into the vacuum chamber 1) can be greatly enhanced, and a deposition rate can be enhanced without increasing a supply rate of the Hf-based gas. Furthermore, material costs relating to the film deposition can be reduced.

In addition, when the above-mentioned fluorine-based fluid or water is used as the coolant supplied to the rectifying member 81, which makes the rectifying member 81 heavy, the rectifying member 81 is difficult to be supported by cantilever. In contrast, as discussed above, the engagement part 91 and the supporting part 93 are respectively formed at the tip side and the base end side of the rectifying member 81, by which the rectifying member 81 is supported at one end and the other end in a longitudinal direction of the rectifying member 81. Moreover, the one end side and the other end side are away from an area relating to the film deposition process in the above-mentioned film deposition apparatus. Because of this, the rectifying member 81 can be supported without adversely affecting the film deposition process, or reducing a negative effect to the film deposition process. In other words, the rectifying member 81 is an optimum mode as a configuration of cooling the first process gas nozzle 31 without preventing the film deposition process in a film deposition apparatus that performs a film deposition process while rotating a wafer W by the turntable 2. Accordingly, occurrence of the deflection or breakage of the rectifying member 81 while performing the film deposition process can be reduced, and the configuration of the apparatus can be simplified.

Figure 8:
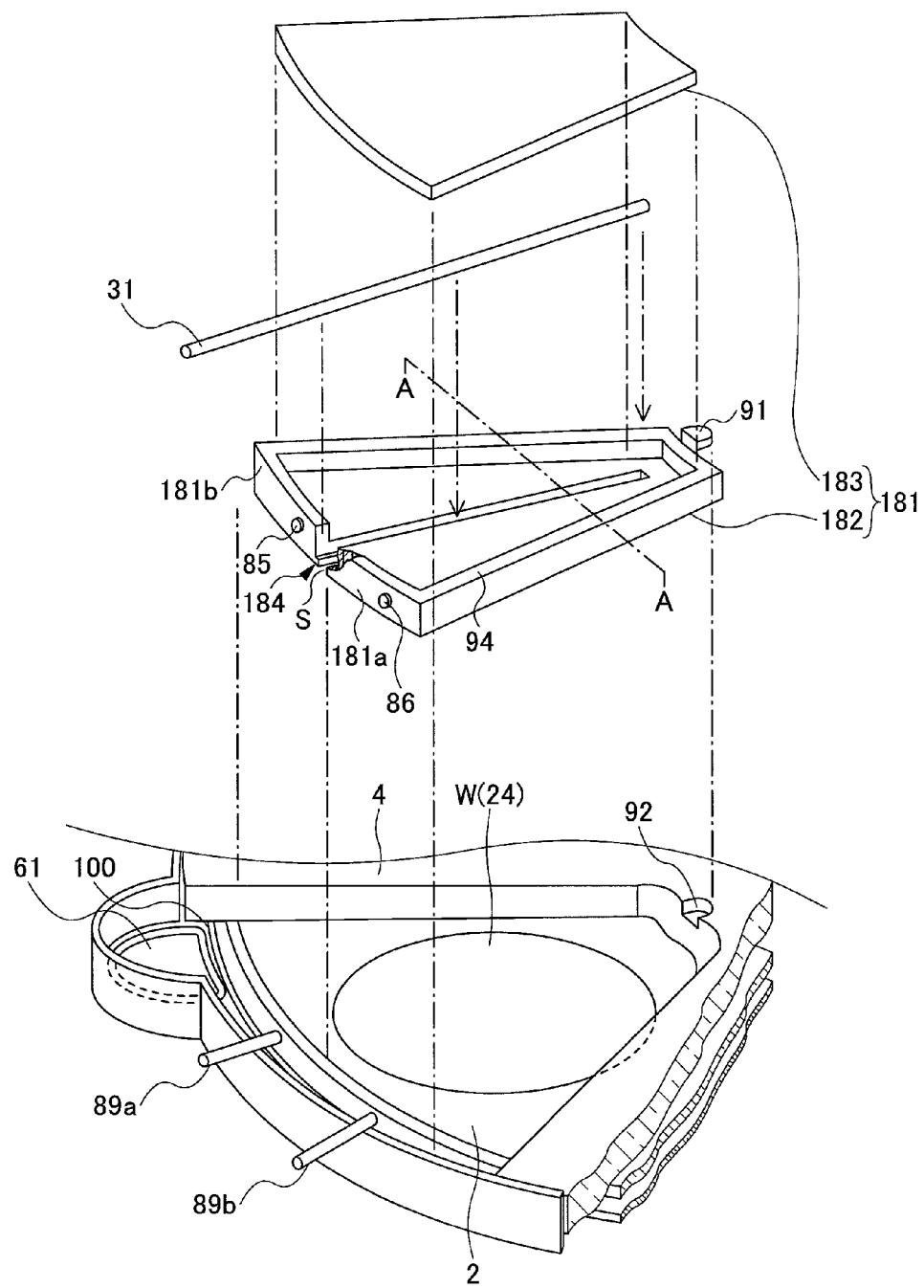
FIG. 8 is an exploded perspective view illustrating a second example of the rectifying member.
Figure 9:
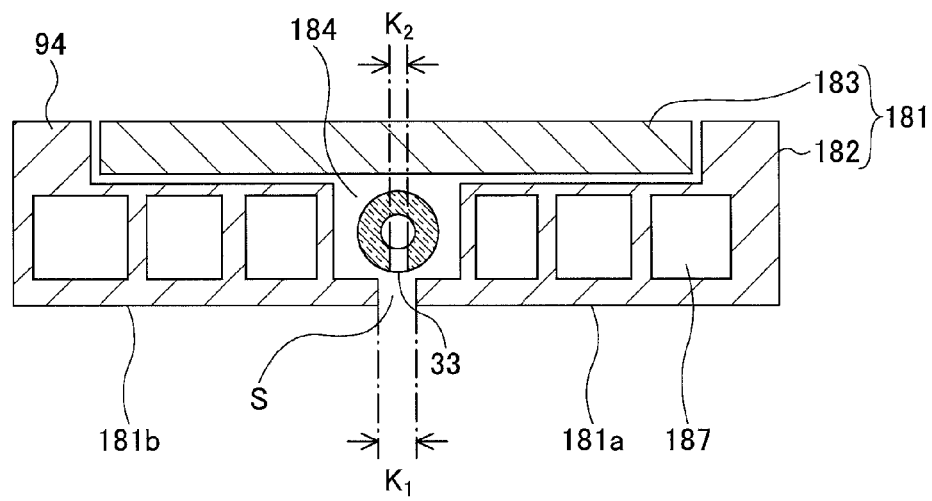
FIG. 9 is a vertical cross-sectional view illustrating the rectifying member in the second example.

Subsequently, a description is given below of another example of the rectifying member 81. FIG. 8 illustrates an example of a rectifying member 181 configured so that the first process gas nozzle 31 is concealed from the wafer W as much as possible through a gap region S between the rectifying members 181a and 181b on both sides of the first process gas nozzle 31. More specifically, as illustrated in FIG. 9, the rectifying members 181a and 181b on both sides of the first process gas nozzle 31 are directly cooled by the coolant flowing through a coolant flow passage 187. On the other hand, the first process gas nozzle 31 is indirectly cooled by the rectifying members 181a and 181b. In other words, when the first process gas nozzle 31 starts increasing in temperature by radiant heat from the wafer W, because the first process gas nozzle 31 radiates heat to the rectifying members 181a and 181b on both sides, the temperature of the first process gas nozzle 31 is likely to be higher than the temperature of the rectifying members 181a and 181b. Hence, to reduce the increase in temperature of the first process gas nozzle 31, as described below, a configuration preventing the radiant heat from reaching the first process gas nozzle 31 as much as possible is preferable.

More specifically, as illustrated in FIG. 9, with respect to a lower member 182 on the upstream side of the first process gas nozzle 31 in the rotational direction of the turntable 2, the lower end on the nozzle 31 side horizontally extends toward the downstream side in the rotational direction of the turntable 2 through the radial direction of the turntable 2 at a position lower than the first process gas nozzle 31. Furthermore, with respect to the lower member 182 on the downstream side of the first process gas nozzle 31 in the rotational direction of the turntable 2, the lower end on the first process gas nozzle 31 horizontally extends toward the nozzle 31 side through the radial direction of the turntable 2 at the position lower than the first process gas nozzle 31.

Figure 10:
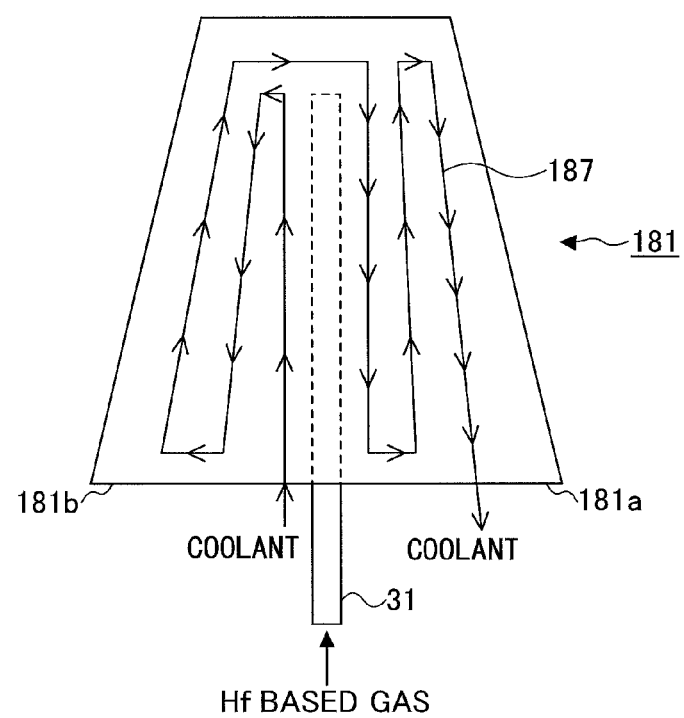
FIG. 10 is a schematic view illustrating a flow passage of a coolant in the rectifying member in the second example.

As illustrated in FIG. 10, the coolant flow passage 187 in the rectifying members 181a and 181b on both sides of the first process gas nozzle 31 is connected to each other through a region closer to the rotational center of the turntable 2 than the tip of the first process gas nozzle 31, instead of connecting to each other through an upper member 183. The upper member 183 is configured to be a plate-like body attachable to and detachable from the lower member 182. Because of this, a recess broader than a width dimension of the first process gas nozzle 31 is formed in the lower member 182, the upper member 183 is arranged to cover the broad hollow. FIGS. 8 and 9 illustrate a wall surface part 94 formed in the outer periphery of the upper end of the lower member 182 along a circumferential direction to define a position of the upper member 183 relative to the lower member 182. Here, in FIG. 8, the wall surface part 94 is schematically depicted by cutting a part of the front side (outer periphery side of the turntable 2).

When an opening size of the gas discharge holes 33 in the first process gas nozzle 31 are expressed as "k2", a distance between the rectifying members 181a and 181b (a width dimension of the gap area S) k1, is larger than the opening size k2. In this example, the distance k1 is twice to four times as large as the opening size k2. Accordingly, the first process gas nozzle 31 is hidden from the wafer W side compared to FIG. 4 described above. More specifically, a slit-like gap is formed in the rectifying member 181 so as to face the gas discharge holes 33 of the first process gas nozzle 31. Hence, the residue is furthermore difficult to attach to the surface of the first process gas nozzle 31 than the example described above. In this example, the opening size k2 is, for example, 0.5 mm, and the distance k1 is, for example, 1 to 2 mm.

Here, when the rectifying members 181a and 181b approach each other, because the Hf-based gas discharged from the first process gas nozzle 31 becomes difficult to circulate to the wafer W side, the hf-based gas is likely to disperse without depositing on the wafer W. However, because the upper member 183 is arranged on the upper side of the first process gas nozzle 31, which prevents the Hf-based gas from diffusing upward, the Hf-based gas flows toward the wafer W side.

A description is given below of a method of attaching the rectifying member 181 and the first process gas nozzle 31 to the vacuum chamber 1 when the rectifying member 181 is configured as illustrated in FIG. 8. More specifically, to begin with, the lower member 182 is installed above the turntable 2. Next, the first process gas nozzle 31 is inserted into the vacuum chamber 1, and a height position and/or an inclination angle of the first process gas nozzle 31 is adjusted. Subsequently, the upper member 183 is fitted into the lower member 182. In this manner, the first process gas nozzle 31 and the rectifying member 181 can be readily installed while configuring the first process gas nozzle 31 and the rectifying member 181 so as to conceal the first process gas nozzle 31 from the wafer W side as much as possible.

Figure 11:
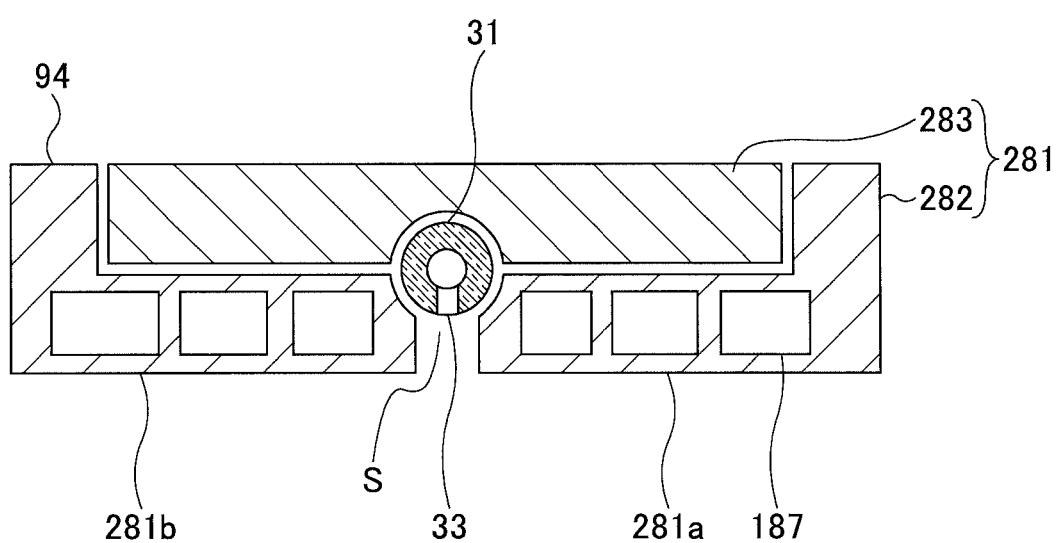
FIG. 11 is a vertical cross-sectional view illustrating a third example of the rectifying member.

As illustrated in FIGS. 8 through 10, when the upper member 183 is configured to be attachable to and detachable from the lower member 182, as illustrated in FIG. 11, it is preferable to form a lower end of an upper member 283 and an upper end of a lower member 282 facing the first process gas nozzle 31 into an arch-like shape, and to bring the rectifying member 281 as close as possible to the first process gas nozzle 31. When the rectifying member 281 is configured as illustrated in FIG. 11, the increase in temperature of the first processing gas nozzle 31 can be further reduced.

Figure 12:
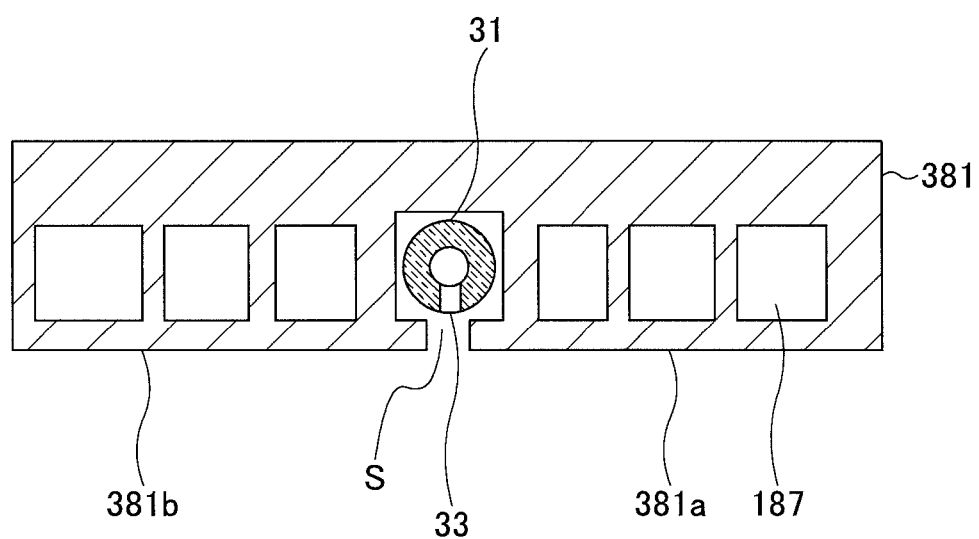
FIG. 12 is a vertical cross-sectional view illustrating a fourth example of the rectifying member.

In addition, as illustrated in FIG. 12, the lower member 182 and the upper member 183 are integrally constituted as a rectifying member 381, and after the rectifying member 381 is installed into the vacuum chamber 1, the first process gas nozzle 31 may be inserted into the vacuum chamber 1 and the rectifying member 381. In FIG. 12, a width dimension of the gap area S is set the same as the examples in FIGS. 8 through 10 and 11 described above.

Figure 13:
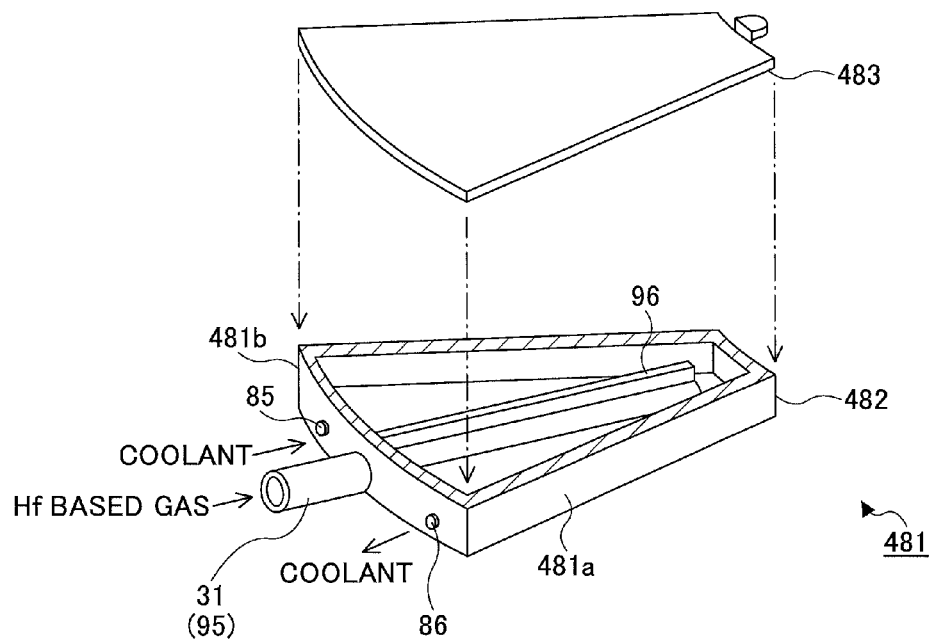
FIG. 13 is an exploded perspective view illustrating a fifth example of the rectifying member.
Figure 14:
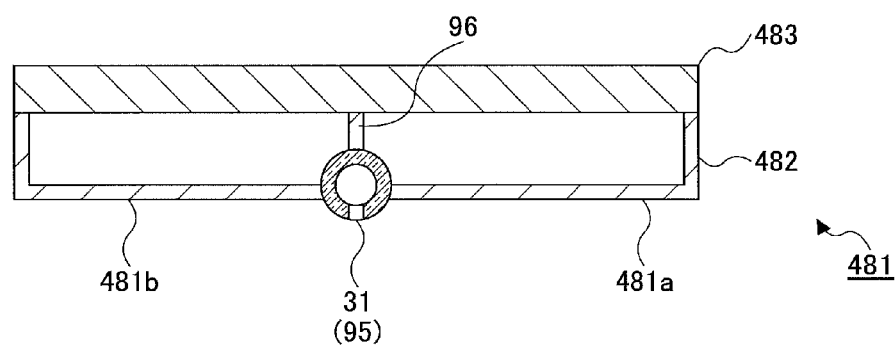
FIG. 14 is a vertical cross-sectional view illustrating the fifth example of the rectifying member.

FIGS. 13 and 14 illustrate an example of constituting the first process gas nozzle 31 and a rectifying member 481 of the same material (e.g., quartz), and integrating the first process gas nozzle 31 with the rectifying member 481. More specifically, the rectifying member 481 is formed into a hollow shape, and a central part on the lower surface side of the rectifying member 481 is linearly opened along the radial direction of the turntable 2. Moreover, with respect to a side wall portion on the outer edge side of a lower member 482, the central part on the lower end side is cut out in an approximate circular shape. Furthermore, a wall surface portion 96 is formed to extend downward from an upper member 483 so as to face an opening 95 on the lower surface side of the lower member 482, and the wall surface portion 96 is formed from the side wall portion on the outer edge side of the rectifying member 481 to a position slightly away from the side wall portion on the rotational center side of the turntable 2 to the outer edge side.

In addition, the first process gas nozzle 31 is inserted into the opening 95 from the lower side, and the bottom portion of the rectifying member 481 and the lower end portion of the wall surface portion 96 that contact the first process gas nozzle 31 are welded to the first process gas nozzle 31. Moreover, by welding the lower member 482 and the upper member 483 together, the first process gas nozzle 31 and the rectifying member 481 are integrated as described above. The coolant supply pipe 89a and the coolant discharge pipe 89b are constituted of the same material as that of the first process gas nozzle 31 and the rectifying member 481, and are welded to the rectifying member 481.

When a coolant is supplied from the coolant supply port 85 into the rectifying member 481, the coolant circulates in the rectifying member 481 along the longitudinal direction of the first process gas nozzle 31 on the left side of the wall surface portion 96 (i.e., the downstream side in the rotational direction of the turntable 2). Then the coolant flows around an area on the back side, and flows toward the coolant discharge port 86 on the right side area of the first process gas nozzle 31. Thus, by constituting the rectifying member 481 of quartz, metal contamination to the wafer W can be reduced.

Figure 15:
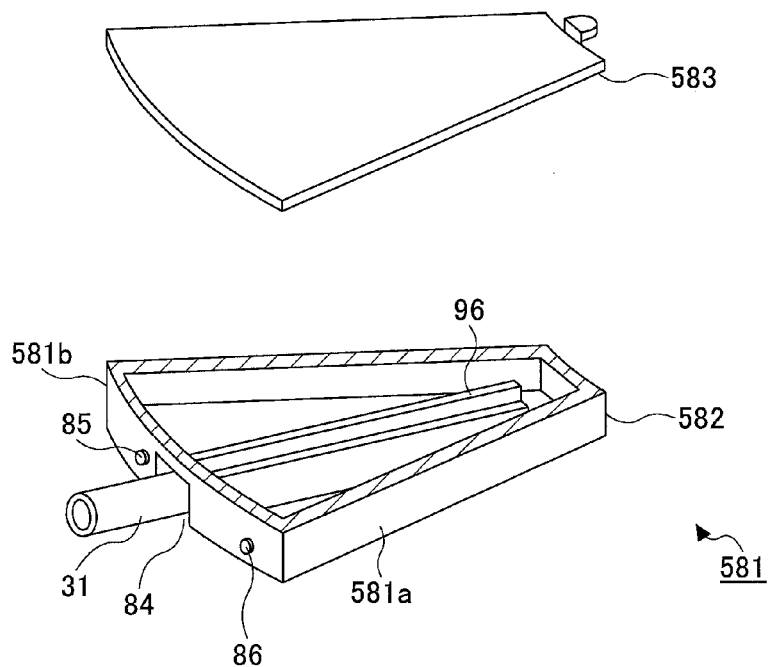
FIG. 15 is an exploded perspective view illustrating a sixth example of the rectifying member.
Figure 16:
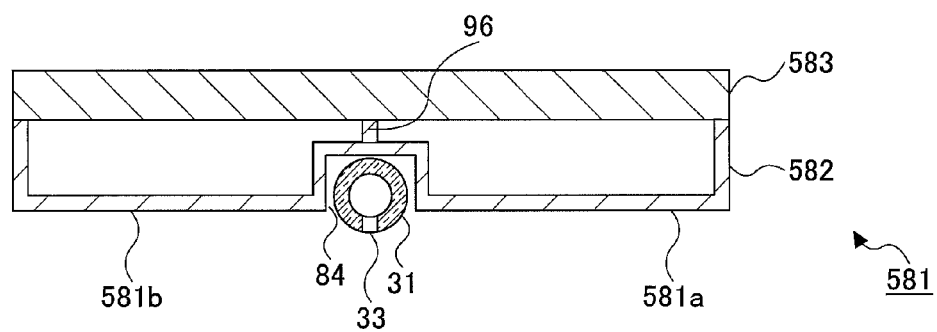
FIG. 16 is a cross-sectional view illustrating the sixth example of the rectifying member.

When forming the rectifying member 481 into an approximately hollow shape as illustrated in FIGS. 13 and 14, and by forming the groove portion 84 in the lower surface side of a rectifying member 581, as illustrated in FIGS. 15 and 16, the rectifying member 581 and the first process gas nozzle 31 may be configured to be separated from each other. Here, in FIGS. 15 and 16, a description is omitted of the same components as the above-mentioned examples by putting the same numerals.

In the above examples, the coolant flow passages 87 and 187 in the rectifying members 81a, 181a, ..., 581a and 81b, 181b, ..., 581b on both sides of the first process gas nozzle 31 are shared with each other, but the respective ports 85 and 86 are individually formed in rectifying members 81a-581a and 81b-581b. Accordingly, with respect to the rectifying member 81-581, only the rectifying members 81a-581a and 81b-581b may be arranged on both sides of the first process gas nozzle 31 without providing the upper member 83-583.

Furthermore, with respect to the configuration of supporting the rectifying member 81-581, the engagement part 91 may be provided only on the central side of the turntable 2 because the coolant supply pipe 89a and the coolant discharge pipe 89b respectively extending from the inner wall surface of the vacuum chamber 1 are attached to the vacuum chamber 1 on the outer edge side in the rectifying member 81-581. The gas discharge holes 33 in the first process gas nozzle 31 may be formed to face, for example, the upstream side in the rotational direction of the turntable 2 so as to supply a process gas to the wafer W side through the side surface portion of the rectifying member 81a-581a instead of forming the gas discharge holes 33 in the lower surface of the first process gas nozzle 31. In addition, the gas discharge holes 33 in the first process gas nozzle 31 may be formed into a slit-like shape extending along the longitudinal direction of the first process gas nozzle 31. Moreover, the rectifying plate 97 described in FIGS. 2 through 4 may be applied to the rectifying members 81-581 of the respective examples in FIGS. 8 through 16.

With respect to the source gas (first process gas) used in performing the film deposition process described above, instead of the Hf-based gas, for example, a Zr (zirconium) based gas, a Sr (strontium) based gas, a Al (aluminum) based gas, a Si (silicon) based gas or the like may be used. The heating temperature of the wafer W is set at a thermal decomposition temperature or greater for each of the gases.

As described above, according to the film deposition apparatus in the embodiments of the present invention, in supplying a source gas from a gas injector to a substrate rotating by a turntable, a rectifying member extending along the gas injector on the upstream side and the downstream side of the gas injector in a rotational direction of the turntable is provided. Then the gas injector is cooled through the rectifying member by circulating a coolant inside the rectifying member. Because of this, adhesion of the source gas by thermal decomposition on a surface of the injector can be prevented.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A film deposition apparatus, comprising:
    a vacuum chamber;
    a turntable provided in the vacuum chamber and configured to rotate a substrate receiving area to receive a substrate;
    a heating mechanism configured to heat the substrate on the turntable;
    a gas injector extending in a direction crossing a moving path of the substrate on the turntable and having a plurality of gas discharge holes formed along the direction crossing the moving path to supply a source gas to the substrate receiving area;
    a rectifying member arranged on an upstream side and a downstream side of the gas injector in a rotational direction of the turntable so as to extend along a longitudinal direction of the gas injector and to include a coolant flow passage formed therein;
    a coolant supply port and a coolant discharge port to circulate a coolant through the coolant flow passage;
    a reaction gas supply part to supply a reaction gas to react with the source gas to the substrate receiving area and to be positioned away from the gas injector in a circumferential direction of the turntable; and
    an exhaust port to evacuate the vacuum chamber.

2. The film deposition apparatus of claim 1, wherein the rectifying member is configured to surround both sides and an upper part of the gas injector.

3. The film deposition apparatus of claim 1, wherein the heating mechanism heats the substrate to a thermal decomposition temperature of the source gas or higher when a film deposition process to the substrate is performed.

4. The film deposition apparatus of claim 1, wherein a slit-like gap broader than a diameter of the gas discharge holes and facing an array area of the gas discharge holes is formed in the rectifying member below the gas injector.

5. The film deposition apparatus of claim 1, wherein the rectifying member includes a lower part provided under the gas injector and has a gap broader than a diameter of the gas discharge holes and an upper member that covers the gap provided attachable to and detachable from the lower part.

6. The film deposition apparatus of claim 1, further comprising:
    a wall surface portion provided around the rotational center of the turntable and extending downward from a ceiling surface of the vacuum chamber so as to face a tip of the rectifying member; and
    a supporting part provided on the tip of the rectifying member to support the rectifying member by the wall surface portion.

* * * * *